United States Patent [19]

Abou et al.

[11] Patent Number: 5,101,198

[45] Date of Patent: Mar. 31, 1992

[54] METHOD AND DEVICE FOR THE TRANSMISSION OF DATA BETWEEN STATIONS OF A COMMUNICATIONS NETWORK, IN PARTICULAR FOR MOTOR VEHICLES

[75] Inventors: Bruno Abou; Patrick Herbault, both of Paris; Joël Malville, Chambly, all of France

[73] Assignees: Automobiles Peugeot, Paris; Automobiles Citroen, Neuilly/Seine, both of France

[21] Appl. No.: 483,066

[22] Filed: Feb. 22, 1990

[30] Foreign Application Priority Data

Feb. 22, 1989 [FR] France .............................. 89 02307

[51] Int. Cl.⁵ ............................................... H04B 3/00
[52] U.S. Cl. .................................. 340/825.5; 341/55; 341/102
[58] Field of Search ............... 340/825.5; 341/68, 69, 341/70, 177, 178, 179, 182, 55, 61, 64, 102; 371/61; 375/55, 87; 307/9.1, 10.1, 10.8; 360/40; 370/85.1, 94.1

[56] References Cited

U.S. PATENT DOCUMENTS

| | | | |
|---|---|---|---|
| 4,346,452 | 8/1982 | Groves | 375/55 |
| 4,746,898 | 5/1988 | Loeppert | 341/70 |
| 4,747,113 | 5/1988 | Viallevieille | 341/68 |
| 4,763,338 | 8/1988 | Barndt, Sr. | 375/87 |
| 4,769,723 | 9/1988 | Tran | 360/40 |

FOREIGN PATENT DOCUMENTS

| | | | |
|---|---|---|---|
| 0058443 | 4/1982 | Japan | 341/70 |
| 0107953 | 6/1985 | Japan | 341/70 |
| 0248025 | 12/1985 | Japan | 341/69 |
| 60-199258 | 2/1986 | Japan | |

OTHER PUBLICATIONS

IBM Technical Disclosure Bulletin, vol. 28, No. 10, Mar. 1986, pp. 4440-4441, "Group encoding method for infrared communication".

*Primary Examiner*—Donald J. Yusko
*Assistant Examiner*—Dervis Magistre
*Attorney, Agent, or Firm*—Burns, Doane, Swecker & Mathis

[57] ABSTRACT

This method is characterized in that the data is encoded in the form of blocks of four bits in five-bit words, three bits (7) of each block being encoded according to the NRZ encoding method and one bit (8), according to the Manchester encoding method.

4 Claims, 4 Drawing Sheets

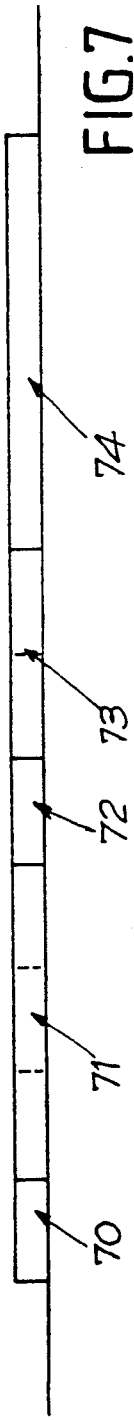
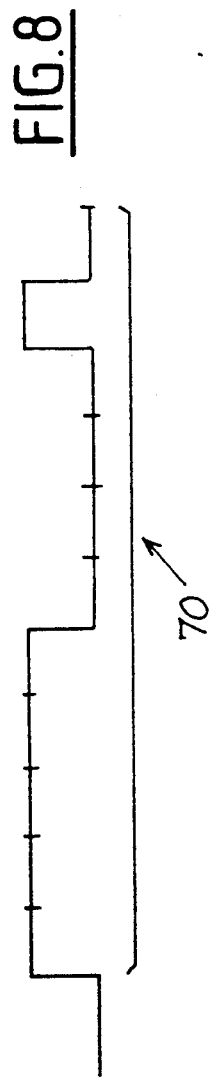
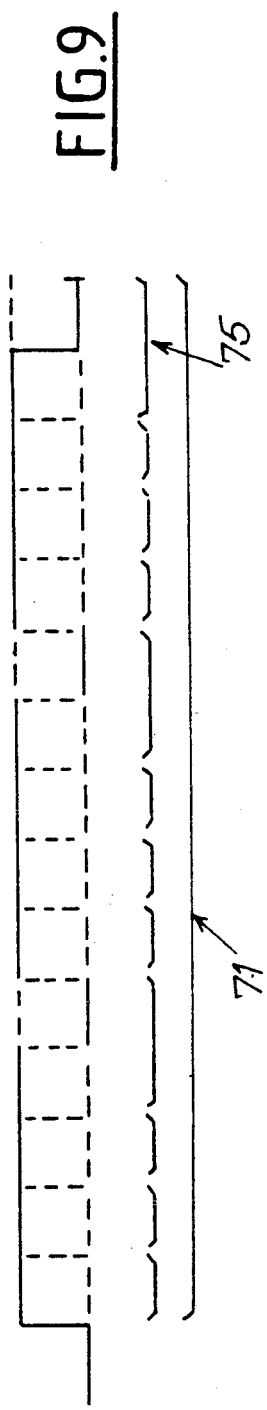
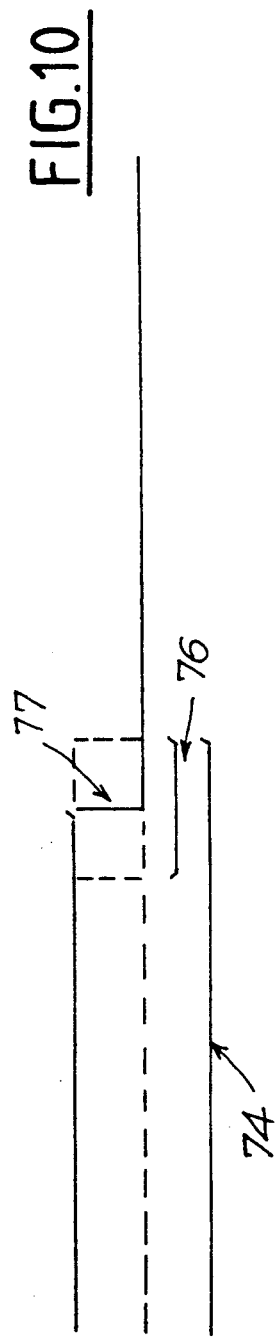

METHOD AND DEVICE FOR THE TRANSMISSION OF DATA BETWEEN STATIONS OF A COMMUNICATIONS NETWORK, IN PARTICULAR FOR MOTOR VEHICLES

BACKGROUND OF THE INVENTION

The present invention relates to a method and a device for the transmission of data between stations of a communications network, in particular for motor vehicles.

Various communications networks, such as those proposed in particular for inter-connecting stations or electronic equipments of a motor vehicle, use a bit-by-bit arbitration access method. In particular, it is possible to mention the following communications protocols.

the J 1850 protocol (SAE)

the $C^2D$ protocol (Chrysler)

the CAN protocol (Bosch)

This access method depends on the fact that the physical bus of the transmission networks can have two separate states and that in the case of the simultaneous transmission of the two states, one of the states is systematically given priority and is called the dominant state.

The other state is called the recessive state and corresponds to the free bus state.

When several stations wish to access the network at the same time, after being synchronized at the start of the message, they transmit, in parallel, their respective messages and stop transmitting as soon as, having transmitted a recessive bit, they read a dominant bit on the bus indicating that a station having a greater priority than them is maintaining access to the network.

The conventional techniques for carrying out the bit coding are as follows:

PWM coding (Pulse Width Modulation) in which a bit is represented by a rectangular pulse corresponding to the value of the bit, preceded by a dominant pulse and followed by a recessive pulse, Manchester encoding method in which a bit is represented by a rectangular pulse corresponding to the value of the bit, followed by a pulse of inverse level, and, NRZ encoding method (Non Return to Zero) in which the bit corresponds to the value of a single rectangular pulse.

For the latter encoding it is necessary to provide a synchronization of a station which is receiving in the case of a succession of bits of the same value.

In the case of use of a simple NRZ encoding method, each transmitted byte is preceded by a dominant start level and followed by a recessive stop level.

This NRZ encoding can be completed by the use of a stuffing bit.

In this case, following a series of n bits of identical level, a bit of opposite value, called a stuffing bit, is inserted during transmission in order to create a transition enabling the resynchronization of the stations.

This bit is suppressed during reception.

This encoding method is the most efficient in terms of encoding efficiency and it is that used in the CAN protocol (Bosch).

However, this encoding method is prone to errors and an interference in the network can cause a desynchronization of one or more bits. If this technique is not used, it is then necessary to accept a partial reduction in the encoding efficiency in order to gain reliability.

In fact, the NRZ encoding method (start-stop) has an efficiency of 80% insofar as an 8-bit byte is encoded in ten bits. This efficiency is acceptable but the transitions allowing the resynchronization of the stations can be spaced by nine bits. It is possible to improve this by encoding the information in the form of blocks of four bits in five-bit words, for an equivalent efficiency, the messages including more transitions.

For example, the FDDI (Fibre Distributed Data Interface) optical network has used a block encoding method of this type.

However, in order to provide a shortest possible continuous component, the five-bit words are such that they comprise either two "1s" and three "0s", or three "1s" and two "0s".

The coding obtained is well suited to a token or polling access method, but it is extremely difficult to implement for a bit-by-bit arbitration method.

In fact, the code conversion performed does not enable a transmitted bit to be associated with an encoded bit.

SUMMARY OF THE INVENTION

The object of the invention is therefore to solve the problems mentioned above by proposing a method and a device providing a direct association between the transmitted bit and the encoded bit, enabling the implementation of a strategy of access to the network using bit-by-bit arbitration, with a possibility of taking into account the rank of the transmitted bit and with great reliability.

For this purpose the object of the invention is a method of transmitting data between stations of a communications network, whose access method is bit-by-bit arbitration, in particular for motor vehicles, characterized in that the data is encoded in the form of blocks of four bits in five-bit words, three bits of each block being encoded according to the NRZ encoding method and one according to the Manchester code.

Advantageously, the bit encoded in Manchester code is the last bit of the block.

According to another aspect, another object of the invention is a device for the implementation of the previously described method.

BRIEF DESCRIPTION OF THE DRAWINGS

The invention will be better understood with the help of the following description given solely by way of example and with reference to the appended drawings in which:

FIG. 7 shows a message encoded using the encoding method according to the invention;

FIGS. 8, 9 and 10 show the details of the encoded message shown in FIG. 7 and;

DESCRIPTION OF THE PREFERRED EMBODIMENTS

Figure 1:
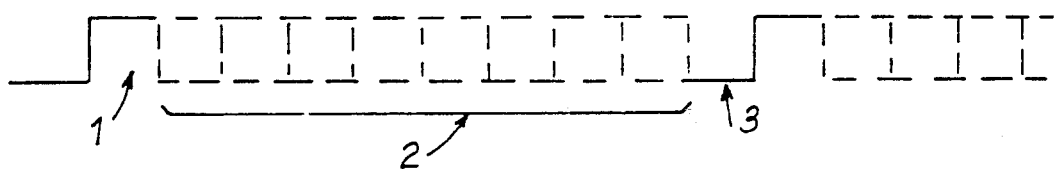
FIG. 1 shows an NRZ (non return to zero) encoding method.

As described before, and as shown in FIG. 1, a NRZ (non return to zero) encoding method begins with the transmission of a start level 1 which is dominant, followed by the byte to be transmitted, this byte being denoted by 2 in this Figure and itself being followed by a recessive stop level 3.

Figure 2:
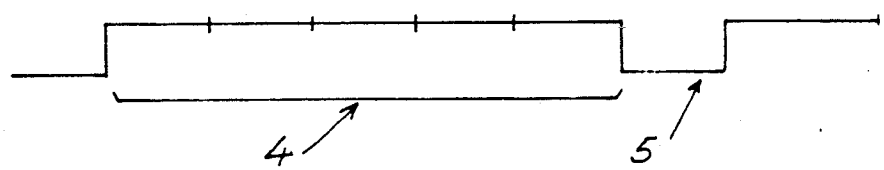
FIG. 2 shows an NRZ encoding method with a stuffing bit.

Another type of encoding, shown in FIG. 2, consists in a NRZ encoding associated with a stuffing bit.

Following a series of n bits of identical level 4, there is inserted during transmission a bit of opposite value 5 to that of the already transmitted bits, this bit being called the stuffing bit, in order to create a transition enabling the resynchronization of the stations.

As explained before, this bit is then suppressed on reception for the analysis.

The NRZ encoding method using a stuffing bit is the most effective in terms of encoding efficiency.

However, this method is extremely sensitive to errors and an interference in the network can generate a desynchronization of one or more bits of the stations.

Figure 3:
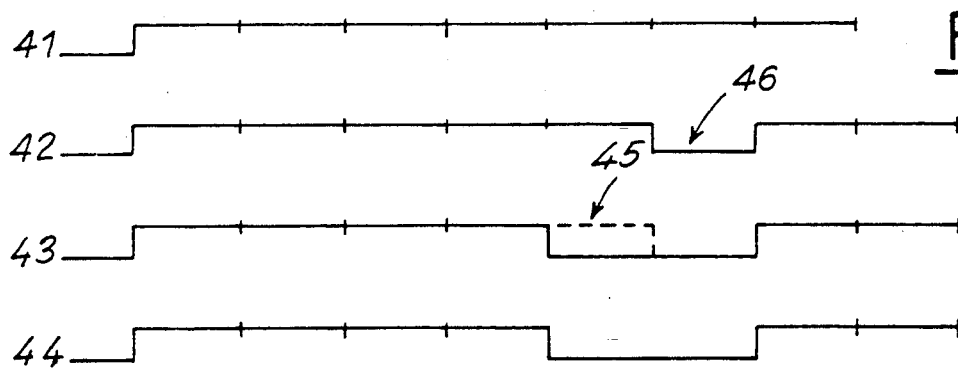
FIGS. 3 and 4 show two examples of disturbed signals whose encoding method is the NRZ encoding method with a stuffing bit.
Figure 4:
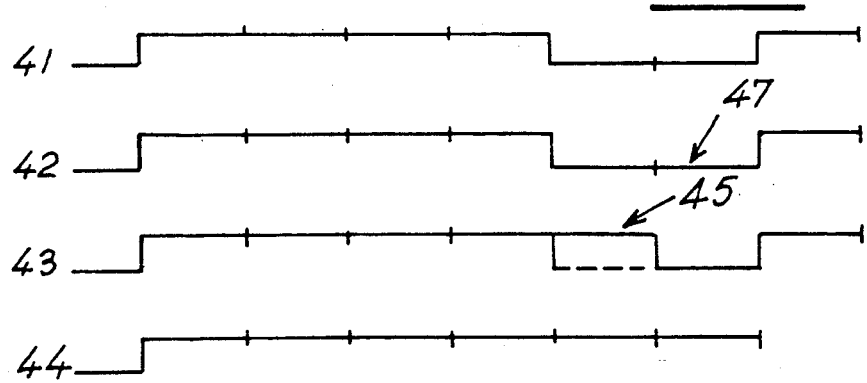

Thus for example, in FIGS. 3 and 4, there have been shown examples of disturbed signals in which the original signal to be transmitted is indicated in 41, the signal encoded using the NRZ encoding technique with a stuffing bit and n=5 is shown in 42, the disturbed signal is shown in 43, the signal decoded with suppression of the stuffing bit is shown in 44, while the disturbed signal 43 includes an incorrect bit 45.

In the first example, shown in FIG. 3, the stuffing bit 46 has been received like a normal bit and because of this the reception is delayed by one bit.

On the other hand, in the second example shown in FIG. 4, a normal transmitted bit 47 has been received like a stuffing bit and because of this the reception is in advance by one bit.

As mentioned before, it is possible to solve certain problems raised by the NRZ encoding method by encoding the data in the form of blocks of 4 bits in 5-bit words in order to obtain an efficiency equivalent to the NRZ encoding method but in which the signals contain more transitions.

Figure 5:
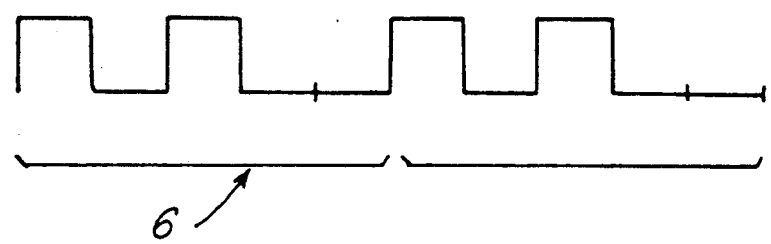
FIG. 5 shows a block encoding method.

As shown in FIG. 5, in the state of the art, in order to obtain the shortest possible continuous component the 5-bit words are such that they include either two "1s" and three "0s", or three "1s" and two "0s". This FIG. 5 shows the encoding of the byte 6, in hexadecimal.

As mentioned before, the encoding obtained is well suited to a token or polling access method, but is difficult to implement for a bit-by-bit arbitration method insofar as the code conversion carried out does not allow a transmitted bit to be associated with an encoded bit.

The transmission method according to the invention retains the concept of encoding in four-bit blocks and five-bit words, but achieves a direct association between a transmitted bit and an encoded bit, thus enabling the use of a network access strategy with bit-by-bit arbitration, with the possibility of taking into account the rank of the transmitted bit.

Figure 6:
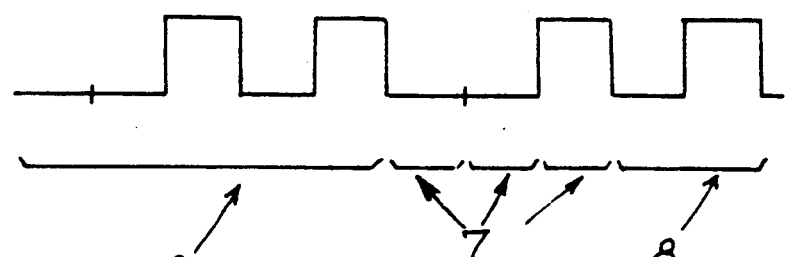
FIG. 6 shows a first embodiment of an encoding method according to the invention.

For this purpose, and as can be seen in FIG. 6, the encoding of each block is carried out by encoding three bits according to the NRZ encoding method, these three bits being shown by the reference 7 in this figure and one bit using the Manchester code, as indicated by 8.

Because of this, a direct association between a transmitted bit and an encoded bit is provided. However, the bit encoded using the Manchester method is specifically processed subsequently and on the one hand must include a transition guaranteeing a possibility of resynchronization of the stations and, on the other hand, it is better protected from errors insofar as a double error is necessary in order to disturb two successive rectangular pulses in order to generate a non-detected error bit.

In order to take advantage of this feature, the bit encoded in Manchester code is placed in such a way as to provide security to the most important bits of the message and to generate systematic transitions at the desired instants in the frame. This is obtained in particular in the example message shown in FIG. 7 by systematically encoding the last bit of each half-byte in Manchester code.

Thus for example, a message frame can comprise (FIG. 7):

a start of message 70 shown in greater detail in FIG. 8;

a message header 71 of 12 bits including as a last bit a question-answer bit which, encoded in Manchester code, is more particularly protected;

a half-byte 72 giving the size of the transmitted data;

data 73 transmitted in bytes; and a cyclic redundancy code 74 over 1 or 2 bytes of which the last bit, encoded in Manchester code, validates the end of the message and provides a systematic last transition.

FIG. 9 more particularly shows the 12-bit message header 71 including, as a last bit, a question-answer bit 75 which is encoded in Manchester code and which, as mentioned previously, is more particularly protected.

In FIG. 10 the code of redundancy over 1 or 2 bytes includes a last bit 76 encoded in Manchester code validating the end of the message and providing a systematic last transition 77. This last time reference enables the generation of the time necessary for an acknowledgement of reception or the time separating two message frames.

The device for the implementation of a method such as described above is characterized in that at least some of the stations of the network include means of data reception and transmission provided with an encoder-decoder capable of carrying out an encoding and a decoding according to the NRZ method and according to the Manchester method, the functioning of this encoder-decoder being switched over as a function of the counting of the bits of a signal transmitted or received by the station after the transmission or reception of a third bit.

Figure 11:
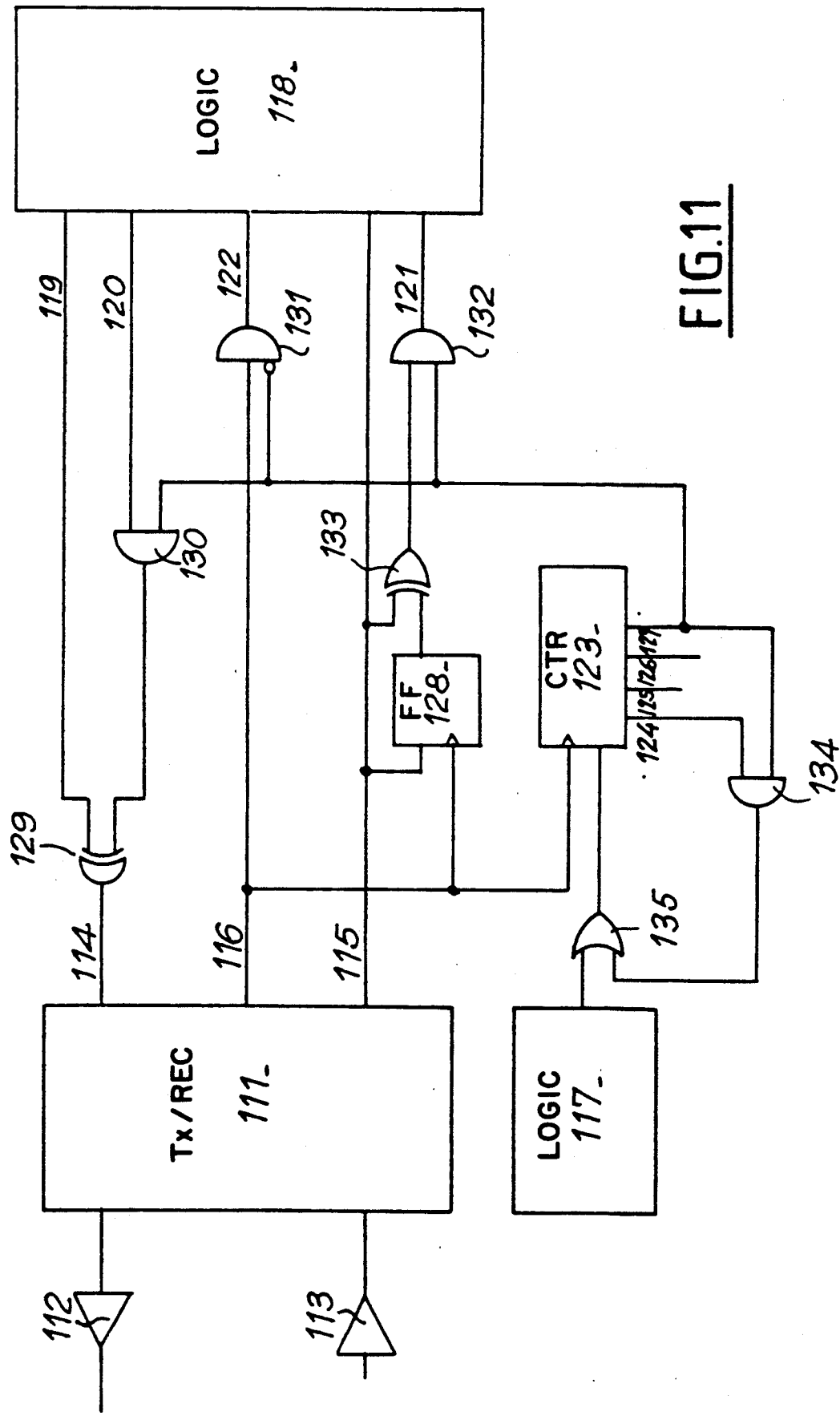
FIG. 11 shows a part of a device for the implementation of a method according to the invention.

These means are shown in FIG. 11 and include a unit for the transmission and reception 111 of rectangular pulses, also called the physical bit. This block is connected to the data transmission network bus of the vehicle via a transmission buffer 112 and a reception buffer 113.

This unit receives, on input, the physical bits to be transmitted, over a link 114, and transmits, on output, the physical bit received, by a link 115. On an output 116 of this unit there is transmitted a physical-bit clock by self-synchronization on the line. An associated logic unit 117 transmits the start of message, while a logic bit unit 118 represents the interface with the higher communications levels of the station.

This unit 118 transmits a logic bit signal 119 and a code violation request 120. It receives the logic bit signal received at 115 and the code violation detection at 121. The bit clock is provided at 122.

These means also include a counter 123 whose outputs are respectively referenced 124, 125, 126 and 127 and respectively represent the outputs of significance 1, 2, 4 and 8 of this counter.

A flip-flop 128 permits the storage of the last physical bit received.

These means also include a certain number of gates 129, 130, 131, 132, 133, 134 and 135 whose functioning will be described in greater detail below and which provide the links between the various devices previously described.

After the start of the message, the start-of-message detector 117 initializes the physical bit counter 123 at zero. This counter is incremented and the first four clock pulses of the signal 116 provide a transparent functioning of the encoding-decoding means using the NRZ encoding method.

At the fifth pulse of this clock signal 116, the encoding 4 of the counter 123 is decoded by the rising to "1" of the output 127 of significance 4 of this counter which then supplies a signal indicating the Manchester encoding method.

This signal, on transmission, unless it is inhibited by the AND gate 130 because of the signal 120, inverts the level of the logic bit transmitted at 119 in order to generate an inverse level at 114.

On reception, this signal enables, at 121, through the gate 132, the result of the comparison at the output of the gate 133 between the physical bit in progress 115 and the present physical bit stored by the flip-flop 128, thus verifying that a transition is carried out during the Manchester bit.

Finally, this signal inhibits the fifth physical clock pulse 116 by the AND gate 131 in order to allow the passage of only four logic bit clock pulses.

The next clock pulse increments the counter 123 to the value 5 which, decoded by the AND gate 134 connected to the outputs 124 and 127 of this counter, reinitializes this counter to zero via the gate 135 in association with the output signal of the block 117, the output of the gate 135 being connected to a counter reset input 123.

The embodiment of this encoder-decoder therefore has a structure equivalent to that of an encoder-decoder using the Manchester encoding method or using the NRZ encoding method with a stuffing bit and it can therefore be easily implemented in communications circuits using a communications protocol with a bit-by-bit arbitration access method with a frame organized in bytes.

We claim:

1. A method of transmitting data between stations of a communications network using bit-by-bit arbitration access, comprising the steps of:
   encoding data for bit-by-bit arbitration as blocks of four bits in five-bit words, three bits of each block being encoded in NRZ code and one bit being encoded in Manchester code; and
   transmitting said encoded data.

2. A method according to claim 1, wherein the bit encoded in Manchester code is the last bit of the block.

3. A device included in at least one station of a communication network for transmitting data between stations of the communications network using bit-by-bit arbitration access, comprising:
   means for transmitting and receiving data, said transmitting and receiving means further including means for encoding data as clocks of four bits in five-bit words, three bits of each block being encoded in NRZ code and one bit being encoded in Manchester code, and means for decoding said encoded data;
   means for counting the number of NRZ encoded bits of data received or transmitted by said transmitting and receiving means; and
   means for switching said transmitting and receiving means to Manchester encoding-decoding when said counting means detects the transmission or reception of a third NRZ encoded bit in a block of data.

4. Method according to claim 1, wherein the communication network is used for motor vehicles.

* * * * *